United States Patent [19]

Vu

[11] Patent Number: 4,845,674
[45] Date of Patent: Jul. 4, 1989

[54] SEMICONDUCTOR MEMORY CELL INCLUDING CROSS-COUPLED BIPOLAR TRANSISTORS AND SCHOTTKY DIODES

[75] Inventor: Tho T. Vu, Fridley, Minn.

[73] Assignee: Honeywell, Inc., Minneapolis, Minn.

[21] Appl. No.: 569,873

[22] Filed: Jan. 11, 1984

[51] Int. Cl.$^4$ .............................................. G11C 7/00
[52] U.S. Cl. .................... 365/154; 365/175; 365/190
[58] Field of Search ............... 365/154, 174, 175, 189, 365/190, 95

[56] References Cited

U.S. PATENT DOCUMENTS

| | | | |
|---|---|---|---|
| 3,564,300 | 2/1971 | Henle | 365/154 |
| 3,757,313 | 9/1973 | Hines et al. | 365/154 |
| 3,764,825 | 10/1973 | Stewart | 365/154 |
| 3,900,838 | 8/1975 | Wiedmann | 365/154 |

FOREIGN PATENT DOCUMENTS 0095411 11/1983 European Pat. Off. .

OTHER PUBLICATIONS

Wiedmann, "Monolithically Integrated Storage Cell", IBM Tech. Discl. Bull., vol. 22, No. 8A, Jan. 1980, pp. 3265-3267.
Moore, "Schottky Barrier Diode Storage Cell", IBM Technical Disclosure Bulletin, vol. 14, No. 6, Nov. 1971, p. 1683.
S. K. Wiedmann et al., Session XVII: Random Access Memories, 1980, IEEE International Solid-State Circuits Conference.

*Primary Examiner*—Joseph A. Popek
*Assistant Examiner*—Glenn A. Gossage
*Attorney, Agent, or Firm*—William T. Udseth; John G. Shudy, Jr.

[57] ABSTRACT

A semiconductor memory cell includes cross coupled bipolar transistors operated in the forward current mode with power fed to the base of the transistor through Schottky diodes from separate word lines. Bit lines are connected to the transistors' emitters and a high differential current is sensed between the bit lines during read operations. No resistors are included within the cell.

14 Claims, 1 Drawing Sheet (MTL/I²L)

SEMICONDUCTOR MEMORY CELL INCLUDING CROSS-COUPLED BIPOLAR TRANSISTORS AND SCHOTTKY DIODES

BACKGROUND OF THE INVENTION

1. Field of the Invention

This invention relates to bipolar memory cells employing merged transistor logic (MTL) wherein control signals are passed through diodes (preferably Schottky diodes) to the base of transistors and there are no power sources uniquely dedicated to an individual cell.

2. Prior Art

S. K. Wiedmann in "Monolithically Integrated Storage Cell", IBM Technical Disclosure Bulletin, Vol. 22, No. 8A, January 1980 has disclosed the structure and use of high density static memories with extremely low power dissipation using merged transistor logic/integrated injection logic (MTL/I$^2$L).

FIG. 1 depicts an equivalent circuit schematic of the basic Wiedmann et al cell 10 (including bit lines 12 and 14, and word lines 16 and 18, i.e., access lines). As FIG. 1 shows, Wiedmann succeeded in eliminating resistors from cell 10 and feeding cell 10 with power through the word lines. The absence of resistors in the basic cell affords high packing density since resistors require physically distinct regions from the active device regions of cell transistors $T_1$ and $T_2$.

Further, in order to keep the power dissipated by static cell 10 low, the standby current must be very low. For a given supply voltage, this implies a need for a very high resistance (i.e., at least megaohms or possible $10^9$ ohms) to minimize the standby current, which in turn requires large chip areas due to limitations on the sheet resistance of materials.

Feeding power and current to the cells through the word lines allows two resistors (i.e., the resistances asssociated with current sources connected to the word lines but not shown) to serve the same function for an entire column of memory cells as the resistors (not shown) normally included in each memory cell. This allows reduction of the overall size of the semiconductor memory for a given supply voltage as compared to memories where each cell includes its own power supply, while keeping the power dissipated the same.

Wiedmann provides power to $T_1$ and $T_2$ by using currrent injecting transistors $T_3$ and $T_4$. Transistors $T_1$ and $T_3$ form a first half of cell 10 (marked by dashed line 20). Likewise transistors $T_2$ and $T_4$ form the second half of cell 10, both halves being identical.

Each pair of transistors (i.e., $T_1$ and $T_3$, and $T_2$ and $T_4$) are connected in MTL/I$^2$L configuration. This configuration is well known. $T_1$ and $T_2$ are connected with their collector and base regions in the familiar cross-coupled relationship to provide a bistable, regenerative circuit. That is, the base 22 of $T_1$ is connected to the collector 24 of $T_2$ and the base 26 of $T_2$ is connected to the collector 28 of $T_1$. Reading in cell 10 is accomplished by sensing differential currents in conductors 30 and 32.

However, for I$^2$L, $T_1$ and $T_2$ operate in the inverse mode (i.e., current flow is in the direction which affords low current gain as contrasted with the normal or forward mode where current flows in the direction which affords high current gain). Processing of I$^2$L transistor configurations is more limited than the processing of configurations where the resulting transistors operate in the forward current mode because of the restrictions on doping profiles for I$^2$L.

As is well known, the current gain $\beta$ (i.e., collector current divided by base current) of a semiconductor transistor operating in the inverse mode is on the order of 2 to 10. However, $\beta$ for a transistor operating with normal or forward current flow is on the order of 20 to 100, or ten times that of I$^2$L. Thus base current in normally operating semiconductor transistors can be an order of magnitude less than base currents in inverse operating semiconductor transistors in order to provide the same collector current. Also a $\beta$ in the range of 50 is generally desired to insure stable, reproducible current conditions in a memory cell. Packing density is limited in I$^2$L due to limitations on the base width of transistors $T_3$ and $T_4$.

To achieve high packing density, low standby current and low power dissipation, it is therefore highly desirable to provide a solid state memory cell having no resistors in the basic cell structure, which is fed with power through the bit lines and/or word lines and which employs transistors operating in the normal or forward current mode.

SUMMARY OF THE INVENTION

The invention is an electrical circuit, comprising: means for maintaining the flow of electrical current in at least a portion thereof in one of two conditions, the current maintenance means including a first terminal for controlling the flow of current through a second terminal and a third terminal for controlling the flow of current through a fourth terminal; first and second unidirectional current conducting means; first, second, third and fourth current conducting access lines wherein the first access line is directly electrically connected to the first unidirectional current conducting means, the second access line is directly electrically connected to the second unidirectional current conducting means, the third access line is directly electrically connected to the second terminal, the fourth access line is directly electrically connected to the fourth terminal and none of the access lines are directly electrically connected to any other of the access lines.

The means for maintaining the current in one of two conditions is conveniently provided as two n-p-n semiconductor transistors with their respective bases and collectors cross coupled. The first unidirectional current conducting means is connected between the first access (or word) line and the base of one transistor (i.e., a control terminal or region) with the second unidirectional current conducting means being connected between the second access (or word) line and the base of the other transistor (i.e., another control terminal or region). The third and fourth access (or bit) lines can be separately connected to the emitters of the transistors. In this configuration, the transistors can be operated in the normal or forward current conducting mode with power (and electrical current) to the bistable regenerative circuit formed by the cross coupled transistors being supplied through the word lines alone when current is being maintained in one of the two conditions. High packing density is provided by the absence of resistors within the cell.

BRIEF DESCRIPTION OF THE PREFERRED EMBODIMENT

Figure 2:
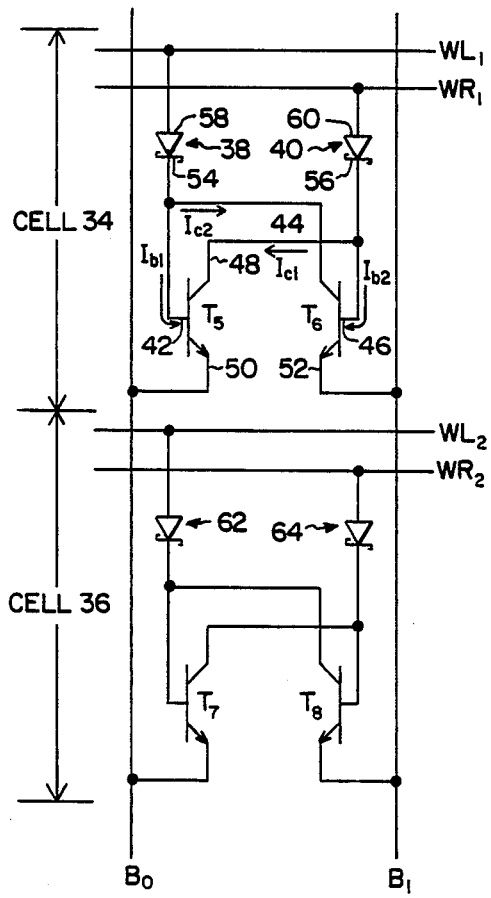
FIG. 2 is an equivalent circuit schematic of two memory cells of the present invention.

FIG. 2 indicates a schematic of two identical memory cells 34 and 36 of the present invention indicating a preferable interconnection layout. Cell 34 includes two inidirectional current (current or electrical current as used herein shall mean conventional current) conducting means such as Schottky diodes 38 and 40, and transistors $T_5$ and $T_6$ (both bipolar n-p-n transistors in this example). The base 42 (i.e., a current control terminal or region) of $T_5$ is cross coupled to the collector 44 of $T_6$. The base 46 (i.e., another current control terminal or region) of $T_6$ is cross coupled to collector 48 of $T_5$. Emitter 50 (i.e., a terminal or region through which current flow is controlled by base 42) is directly electrically connected to bit line Bo (i.e., an access line). Emitter 52 (i.e., a terminal or region through which current flow is controlled by base 46) is directly electrically connected to bit line $B_1$ (i.e., an access line). Word line $WL_1$ (i.e., an access line) is directly electrically connected to Schottky diode 38 and word line $WR_1$ (i.e., an access line) is directly electrically connected to Schottky diode 40.

The above described cross coupling of transistors $T_5$ and $T_6$ provides the basis of a bistable, regenerative electrical circuit. Such a bistable circuit is merely one example of a means for maintaining the flow of current in a portion thereof in one of two conditions (e.g., two opposing directions of current flow). Alternately, transistors $T_5$ and $T_6$ are examples of first and second switching means.

The semiconductor regions 54 of Schottky diode 38 is directly electrically connected to base 42 and collector 44. The semiconductor region 56 of Schottky diode 40 is directly electrically connected to base 46 and collector 48. The metallized portion 58 of diode 38 and the metallized portion 60 of diode 40 are directly electrically connected, respectively, to $WL_1$ and $WR_1$.

Cell 36 includes Schottky diodes 62 and 64, transistors $T_7$ and $T_8$, word lines $WL_2$ and $WR_2$ and portions of bit lines $B_0$ and $B_1$.

The basic storage function of cell 34 occurs when one of transistors $T_5$ and $T_6$ is saturated and the other is off. For illustrative purposes, assume that $T_5$ is on and $T_6$ is off. This will be defined as logic state 1 (if $T_6$ were on and $T_5$ off, this then would be logic 0). For logic 1, the base 42-emitter 50 and base 42-collector 48 junctions of $T_5$ are forward biased. Current will be flowing through Schottky diodes 38 and 40 as shown (see $I_{b1}$ and $I_{b2}$), therefore Schottky diodes 38 and 40 are forward biased.

Since $\beta$ for $T_5$ is greater than one, the current in the collector 48 of $T_5$ ($I_{c1}$) will be larger than $I_{b1}$. With $T_6$ off, $I_{c2}$ is very close to $I_{b2}$ and therefore the voltage drop across diode 40 is larger than the voltage drop across diode 38. This in turn allows for the base 42-emitter 50 junction of $T_5$ to be forward biased while the base 46-emitter 52 junction is reverse biased.

Cell 34 is thus in one of its two bistable states and will remain in that condition until $T_5$ is turned off and $T_6$ is turned on. The cell supply voltage (not shown), current control resistors (on an access line but not shown), and the various potential barrier heights of the PN junctions in transistors $T_5$ and $T_6$ and of diodes 38 and 40 will be appropriately chosen to allow the bistable, regenerative operation of cell 34.

In the standby state, lines $WL_1$, $WR_1$, $B_0$ and $B_1$ are all connected to the same electrical potential, the standby potential being selected so that cell 34 is kept stable at the minimum standby power.

For a read function, "row" and "column" signals are needed which uniquely designate cell 34. The row signal is provided by applying a relatively high electrical potential (i.e., a logic 1 signal) to lines $WL_1$ and $WR_1$. The column signal is provided by lowering the electrical potential on $B_0$ and $B_1$. As the potential on $B_0$ and $B_1$ is lowered, $I_{b1}$, $I_{b2}$ and $I_{c1}$ increase (in our example of logic state 1) and therefore the difference between $I_{b1}$ and $I_{b2}$ increases (i.e., $I_{b1} - I_{b2} \simeq I_{b1}(\beta=1)$). The high differential current thus obtained on bit lines $B_0$ and $B_1$ can be read by a simple read amplifier (not shown). Using Schottky diodes 38 and 40 as current injectors to $T_5$ and $T_6$, results in a much better sense signal voltage than the p-n-p injectors of Wiedmann because no standby state back injector current is required.

To write a logic 1 or a logic 0 in cell 34, the electrical potentials on lines $B_0$ and $B_1$ are lowered as for reading, and a write current is applied to only one of lines $WL_1$ or $WR_1$. The write current will switch on the transistor not connected to the selected word line by diode 38 or 40 (by reverse biasing the base-emitter junction of the transistor connected to the selected word line). For example, if a write current is applied to $WR_1$, $T_6$ is switched off and $T_5$ is switched on and a 1 has been written in cell 34.

An alternative writing operation is to hold $WL_1$ and $WL_2$ at the same electrical potential and lower only the electrical potential of either $B_0$ and $B_1$. Whichever transistor is directly connected to the bit line with the lowered potential will be turned on (by forward biasing its base-emitter junction) thus turning off the other transistor. For example, if only the electrical potential on $B_0$ is lowered, $T_5$ will be turned on, $T_6$ turned off and a 1 will be written into cell 34.

Figure 3:
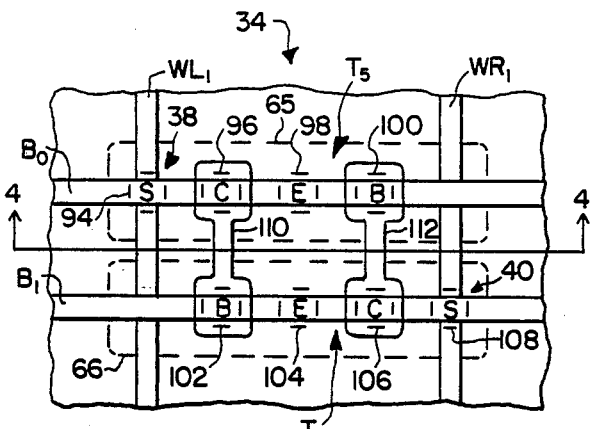
FIG. 3 is a plan view of a portion of an integrated circuit including the memory cell of the present invention.
Figure 4:
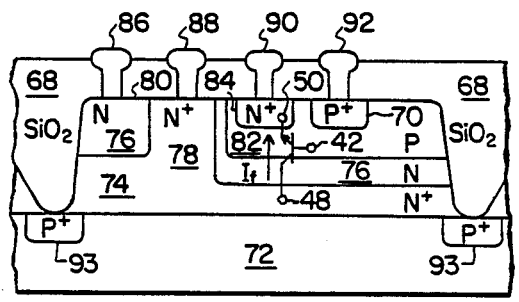
FIG. 4 is a cross section along line 4—4 of FIG. 3.
Figure 1:
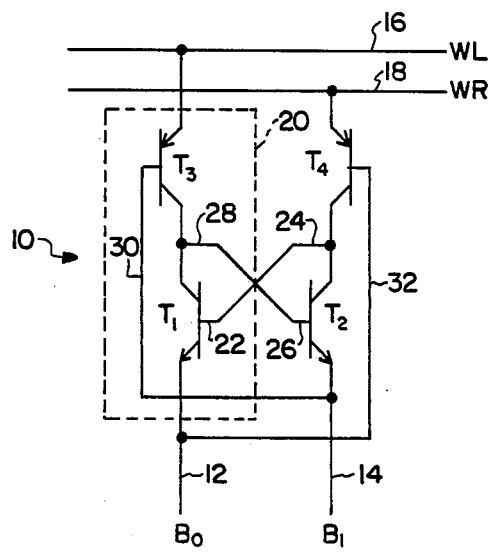
FIG. 1 is an equivalent circuit schematic of Wiedmann's prior art MTL/I$^2$L circuit.

FIG. 3 shows a plan view of cell 34 incorporated into an integrated circuit (the remainder of which is not shown). The interfaces of respective "halves" of cell 34 are shown by dashed lines 65 and 66. FIG. 4 is a cross section of FIG. 3 along line 4—4 showing only half of cell 34. Transistors $T_5$ and $T_6$ are isolated by $SiO_2$ region 68. Corresponding structure in FIGS. 2, 3 and 4 is like-numbered for clarity.

To achieve higher cell performance, transistors $T_5$ and $T_6$ can be made by adding a $P^+$ ion plantation (e.g., see 70 in FIG. 4) through the base contact window. This added $P^+$ region provides optimum doping profiles for the extrinsic base without changing the profile of the intrinsic base.

As seen in FIG. 4, cell 10 is conveniently placed on a doped substrate 72 (e.g., P type). A buried layer 74 is grown on substrate 72. Layer 74 is heavily doped with the opposite conductivity type (i.e., $N^+$) from that of substrate 72. An epitaxial layer 76 is grown on layer 74 and is doped with conductivity carries of the same type as layer 74 but of a lower concentration (i.e, N).

An $N^+$ diffusion 78 is provided from the upper surface 80 of layer 76 and extends to layer 74. A P type diffusion 82 is provided over a portion of surface 80 and extends from surface 80 to less than the thickness of layer 76. Diffusion 82 forms the base of $T_5$. Finally $N^+$ region 84 and P+ region 70 are provided within diffusion 82, to form the emitter of $T_5$ an ohmic base contact, respectively.

Metallized contacts 86, 88, 90 and 92 provide the metallized side 54 of Schottky diode 38 and the collector 48, emitter 50 and base 42 contacts respectively. A P+ guard ring 93 is buried in substrate 72 and surrounds the bottom of each "half" of cell 34 just below the extremes of $SiO_2$ region 68.

The forward current flow of transistor $T_5$ is shown as $I_f$ in FIG. 4. The labels S, C, E and B in FIG. 3 stand for Schottky diode, collector, emitter and base, respectively. Dashed square boundaries 94, 96, 98, 100, 102, 104, 106 and 108 represent contact openings in region 68. Metallized portions 110 and 112 cross couple base 42 and collector 44, and base 46 and collector 48 respectively.

For improved radiation hardness, cell 34 can be made by adding standard $R_B C_{jc}$ technique at the base and collector of each inverting transistor $T_5$ and $T_6$.

From the above description it is seen that cell 34 can be employed as one cell of a RAM.

What is claimed is:

1. A solid state memory, comprising:
   a plurality of memory cells for holding digital data, said cells being comprised of a pair of cross coupled bipolar transistors with each of said transistors having a base, and wherein said cells are arranged in rows and columns;
   conductive access lines to said cells, wherein four of said access lines are connected to each of said cells and said digital data in each of said cells can be altered, without affecting the digital logic state in the remaining of said cells, by the application of electrical signals to said bases of said transisfors;
   current sources for supplying current to said cells to store said digital data, wherein each of said current sources supplies current to more than one of said cells; and
   a plurality of Schottky diodes, wherein said electrical signals are applied to said bases of said transistors within each said cells through a unique pair of said Schottky diodes.

2. An electrical circuit, comprising:
   means for selectively switching the flow of electrical current between one of two conductive paths, said current switching means including a first terminal for controlling the flow of said current through a second terminal, and a third terminal for controlling the flow of said current through a fourth terminal;
   first and second unidirectional current conducting means wherein said unidirectional current conducting means are Schottky diodes; and
   first, second third and fourth current conducting access lines over which digital logic signals can flow, wherein said first access line is directly electrically connected to said first unidirectional current conducting means, said second access line is directly electrically connected to said second unidirectional current conducting means, said third access line is directly electrically connected to said second terminal, said fourth access line is directly electrically connected to said fourth terminal and none of said access lines are directly electrically connected to any other of said access lines.

3. The circuit of claim 2 wherein electrical energy for said current switching means is supplied only through said access lines.

4. The circuit of claim 2 wherein said current switching means is a bistable, regenerative electrical circuit.

5. The circuit of claim 4 wherein said bistable regenerative electrical circuit includes:
   a first bipolar semiconductor transistor having a first base, first emitter and a first collector, wherein said first base is said first terminal; and
   a second bipolar semiconductor transistor having a second base, a second emitter and a second collector, wherein said second base is said third terminal, said first base is directly electrically connected to said second collector and said second base is directly electrically connected to said first collector.

6. The circuit of claim 5 wherein said first and second bipolar semiconductor transistors are adapted to operate in the normal or forward current mode.

7. An electrical circuit, comprising:
   a first electrical device having first, second and third regions wherein said first region is adapted to control the flow of current between said second and third regions;
   a second electrical device having fourth, fifth and sixth regions, wherein said fourth region is adapted to control the flow of current between said fifth and sixth regions, said first region is directly electrically connected to said sixth region and said third region is directly electrically connected to said fourth region;
   a third electrical device having seventh, eighth and ninth regions wherein said seventh region is adapted to control the flow of current between said eighth and ninth regions;
   a fourth electrical device having tenth, eleventh and twelfth regions wherein said tenth region is adapted to control the flow of current between said eleventh and twelfth region, said seventh region is directly electrically connected to said twelfth region and said ninth region is directly electrically connected to said tenth region;
   first, second, third and fourth unidirectional current conducting means, said unidirectional current conducting means being Schottky diodes and being directly electrically connected, respectively, to said first, second, third and fourth regions; and
   first, second, third, fourth, fifth and sixth current conducting access lines, wherein said first, second, third and fourth access lines are directly electrically connected, respectively, to said first, second, third and fourth unidirectional current conducting means, said fifth access line is directly electrically connected to said second region and said eighth region, and said sixth access line is directly electrically connected to said fifth region and said eleventh region.

8. The circuit of claim 7 wherein electrical energy is supplied to said first, second, third and fourth electrical devices only through said access lines.

9. The circuit of claim 7 wherein said first, second, third and fourth electrical devices are bipolar semiconductor transistors.

10. The circuit of claim 9 wherein said bipolar semiconductor transistors are each adapted to operate in the normal or forward current mode.

11. A digital memory circuit, comprising:

means for selectively switching the flow of electrical current between one of two conductive paths, said current switching means including a first terminal for controlling the flow of said current through a second terminal, and a third terminal for controlling the flow of said current through a fourth terminal;

first and second unidirectional current conducting means, wherein said unidirectional current conducting means are Schottky diodes;

first, second, third and fourth current conducting access lines over which digital logic signals can flow, wherein said first access line is directly electrically connected to said first unidirectional current conducting means, said second access line is directly electrically connected to said second unidirectional current conducting means, said third access line is directly electrically connected to said second terminal and said fourth access line is directly electrically connected to said fourth terminal; and an electrical current source, wherein said electrical current source supplies current to said current switching means only through said access lines.

12. The circuit of claim 11 wherein said current switching means is a bistable, regenerative elecrical circuit.

13. The circuit of claim 12 wherein said bistable regenerative electrical circuit includes:
a first bipolar semiconductor transistor having a first base, first emitter and a first collector, wherein said first base is said first terminal; and
a second bipolar semiconductor transistor having a second base, second emitter and a second collector, wherein said second base is said third terminal, said first base is directly electrically connected to said second collector and said second base is directly electrically connected to said first collector.

14. The circuit of claim 13 wherein said first and second bipolar semiconductor transistors are adapted to operate in the forward or normal current mode.

* * * * *

UNITED STATES PATENT AND TRADEMARK OFFICE
CERTIFICATE OF CORRECTION

PATENT NO. : 4,845,674
DATED : July 4, 1989
INVENTOR(S) : Tho T. Vu

It is certified that error appears in the above-identified patent and that said Letters Patent is hereby corrected as shown below:

Column 8, line 5, delete "elecrical" and substitute --electrical--.

Signed and Sealed this

Seventeenth Day of April, 1990

Attest:

HARRY F. MANBECK, JR.

*Attesting Officer*   *Commissioner of Patents and Trademarks*